US009847786B1

(12) United States Patent
Sugano

(10) Patent No.: US 9,847,786 B1
(45) Date of Patent: Dec. 19, 2017

(54) METHODS AND APPARATUS FOR A MULTI-CYCLE TIME-BASED ADC

(71) Applicant: SEMICONDUCTOR COMPONENTS INDUSTRIES, LLC, Phoenix, AZ (US)

(72) Inventor: Takashi Sugano, Kiryu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/613,418

(22) Filed: Jun. 5, 2017

(51) Int. Cl.
*H03M 1/50* (2006.01)
*H03M 1/06* (2006.01)
*H03M 1/64* (2006.01)
*H03M 1/46* (2006.01)
*H03M 1/76* (2006.01)
*G04F 10/00* (2006.01)
*G04F 10/10* (2006.01)

(52) U.S. Cl.
CPC ........ *H03M 1/0697* (2013.01); *G04F 10/005* (2013.01); *G04F 10/105* (2013.01); *H03M 1/462* (2013.01); *H03M 1/50* (2013.01); *H03M 1/64* (2013.01); *H03M 1/765* (2013.01)

(58) Field of Classification Search
CPC ...... H03M 1/0697; H03M 1/765; H03M 1/64; H03M 1/50; H03M 1/462; G04F 10/105; G04F 10/005

USPC .......................................... 341/166, 168, 169
See application file for complete search history.

(56) References Cited

U.S. PATENT DOCUMENTS

| 5,117,227 | A | 5/1992 | Goeke |
| 5,321,403 | A | 6/1994 | Eng |
| 7,916,064 | B2 * | 3/2011 | Lin ........................ H03M 1/50 |
| | | | 341/155 |
| 8,890,741 | B2 * | 11/2014 | Dosho ................. H03M 1/1215 |
| | | | 341/155 |
| 2013/0002467 | A1 | 1/2013 | Wang |
| 2015/0244389 | A1 | 8/2015 | Lim |

FOREIGN PATENT DOCUMENTS

| JP | 2010213024 A | 9/2010 |
| JP | 2012039273 A | 2/2012 |

* cited by examiner

*Primary Examiner* — Khai M Nguyen
(74) *Attorney, Agent, or Firm* — The Noblitt Group, PLLC

(57) ABSTRACT

Various embodiments of the present technology may comprise methods and apparatus for a multi-cycle time-based ADC configured to convert an analog signal to a digital value. Methods and apparatus a multi-cycle time-based ADC according to various aspects of the present invention may comprise a plurality of VTCs configured to perform multiple voltage-to-time conversions out-of-phase from each other. The integration times for each VTC may be summed to provide a total integration time, which may then be converted to the digital value.

20 Claims, 4 Drawing Sheets

METHODS AND APPARATUS FOR A MULTI-CYCLE TIME-BASED ADC

BACKGROUND OF THE TECHNOLOGY

Analog-to-digital converters (ADCs) are utilized in a wide variety of electronic devices and systems to transform an analog signal to a digital signal. One ADC architecture commonly used due to its simple implementation is the single-ramp ADC. The accuracy of a conventional single-ramp ADC, however, is limited by the length of the integration time. In general, the integration time may be increased by increasing the size of the sampling capacitor and/or reducing the supply current. A larger sampling capacitor, however, increases the overall size of the chip, as well as power consumption and cost, and reducing the supply current introduces noise in the signal, which negatively impacts the accuracy of the signal.

SUMMARY OF THE INVENTION

Various embodiments of the present technology may comprise methods and apparatus for a multi-cycle time-based ADC configured to convert an analog signal to a digital value. Methods and apparatus a multi-cycle time-based ADC according to various aspects of the present invention may comprise a plurality of voltage-to-time converters (VTCs) configured to perform multiple voltage-to-time conversions out-of-phase from each other. The integration times for each VTC may be summed to provide a total integration time, which may then be converted to the digital value.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various controllers, amplifiers, signal converters, drivers, switching devices, current sources, logic gates, semiconductor devices, such as transistors, capacitors, and the like, which may carry out a variety of functions. In addition, the present technology may be integrated in any number of electronic systems, such as automotive, aviation, "smart devices," portables, and consumer electronics, and the systems described are merely exemplary applications for the technology. Further, the present technology may employ any number of conventional techniques for voltage-to-time conversion and time-to-digital conversion.

Figure 1:
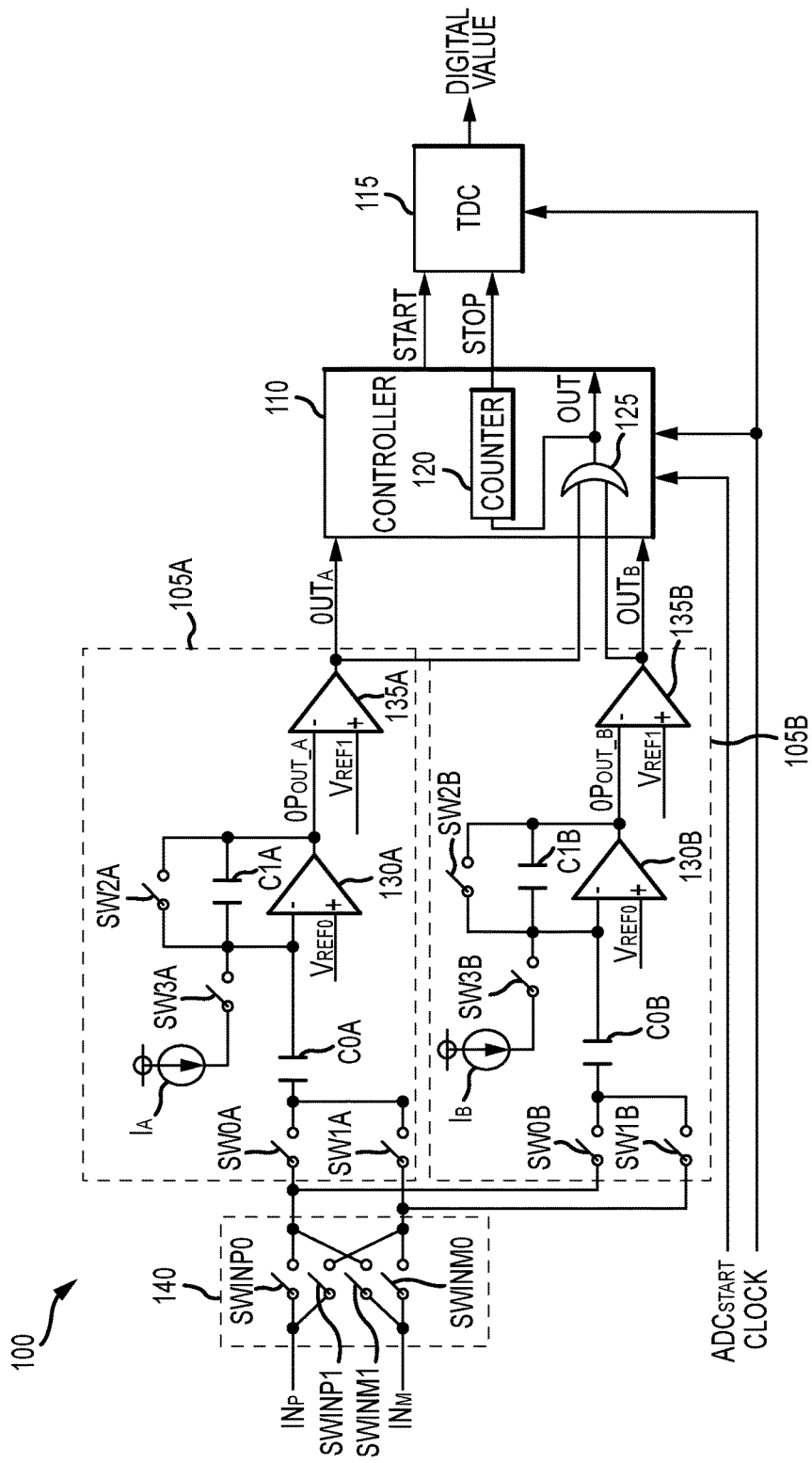
FIG. 1 is a circuit diagram of a multi-cycle time-based ADC in accordance with an exemplary embodiment of the present technology.
Figure 4:
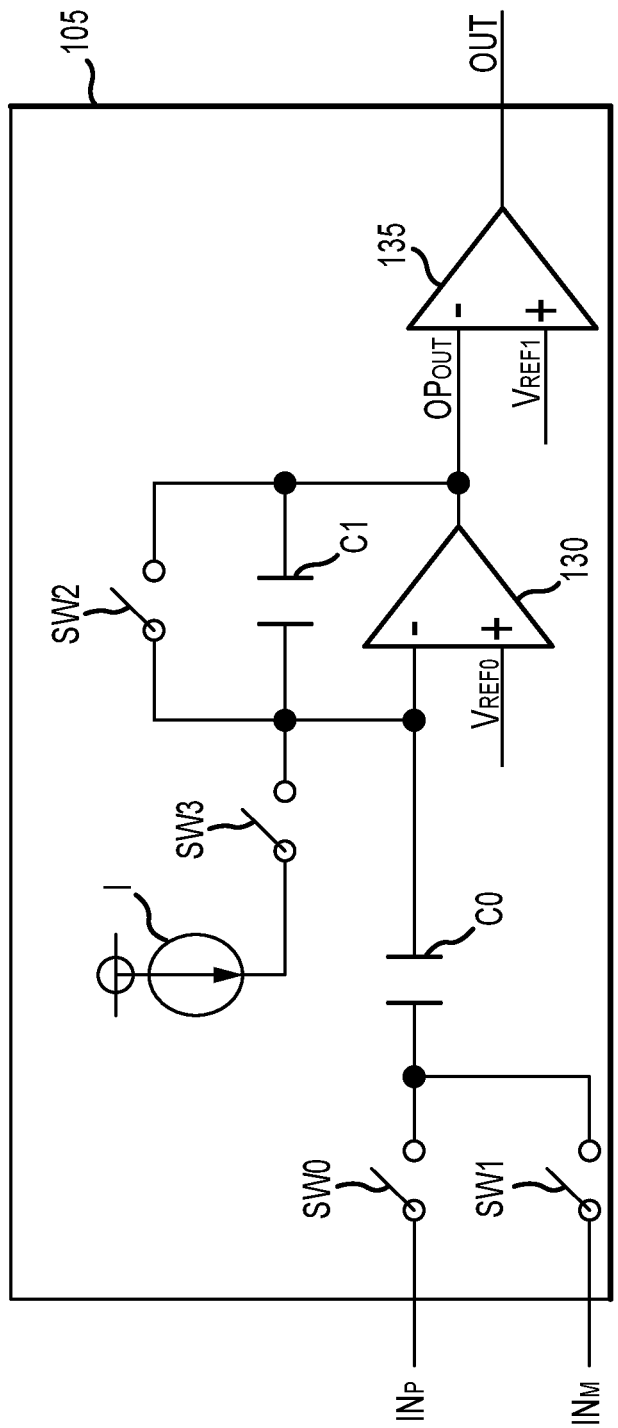
FIG. 4 is a circuit diagram of a voltage-to-time converter in accordance with an exemplary embodiment of the present technology.

Referring to FIGS. 1 and 4, a multi-cycle time-based ADC (the "ADC") 100 according to various aspects of the present technology may utilize various circuits and/or systems to convert an analog signal into a digital value according to time-based techniques for data conversion. The ADC 100 may be configured to generate multiple voltage-to-time conversions and sum multiple integration times to produce the digital value. For example, the ADC 100 may comprise a switching circuit 140, and a voltage-to-time converter (VTC) 105, a controller 110, and a time-to-digital converter (TDC) 115.

In an exemplary embodiment, the ADC comprises a first VTC 105A and a second VTC 105B, wherein the first and second VTCs 105A, 105B may be coupled in parallel. In an exemplary embodiment, the ADC 100 is configured to perform a sample and hold (S/H) operation utilizing one of the VTCs, while the other VTC performs an integration operation. In other words, the integration operations of the VTCs are out-of-phase from each other. Each VTC 105A, 105B cyclically performs the S/H operation and the integration operation for a predetermined number of cycles. According to an exemplary embodiment, each VTC performs the same number of cycles.

The VTC 105 may be configured to sample an input signal, such as a first input signal IN (e.g., a positive input signal) and a second input signal $IN_M$ (e.g., a negative input signal), and convert the sampled input signal to a measurement of time (i.e. a time value). The VTC 105 may comprise any number of components necessary to perform a sample and hold operation, perform an integration operation, and generate the measurement of time. For example, referring now to FIG. 4, the VTC 105 may comprise a first switch SW0, a second switch SW1, a third switch SW2, and a fourth switch SW3, a current source I, a sampling capacitor C0 to store charge during a sample and hold operation, an operational amplifier (op-amp) 130, and a integrating capacitor C1 to stores charge during a integration operation.

According to an exemplary embodiment, and referring to FIG. 1, the first VTC 105A may comprise a conventional VTC, for example the first VTC 105A may comprise a plurality of first switches, such as a first switch SW0A, a second switch SW1A, a third switch SW2A, and a fourth switch SW3A, a first current source $I_A$, a first sampling capacitor, a first op-amp 130A, and a first integrating capacitor C1A. Similarly, the second VTC 105B may be identical to the first VTC 105A and may comprise a plurality of second switches, such as first switch SW0B, a second switch SW1B, a third switch SW2B, and a fourth switch SW3B, a second current source $I_B$, a second sampling capacitor C0B to store charge during a sample and hold operation at a different time than that of the first sampling capacitor C0A, a second op-amp 130B, and a second integrating capacitor C1B to store charge during an integration operation at a different time than that of the first integrating capacitor C1A.

Referring again to FIG. 4, the current source I provides a bias current to the VTC 105. The current source I may be selectively coupled to the op-amp 130 via the fourth switch SW3. The current source I may comprise any suitable circuit for generating a bias current. According to an exemplary embodiment, the first current source $I_A$ is equal to that of the second current source $I_B$.

The op-amp 130 may amplify an input signal, such as the first and second input signals $IN_P$, $IN_M$. The input signals $IN_P$, $IN_M$ may be coupled to an inverting terminal (−) of the op-amp 130A via the first and second switches SW0, SW1 and the sampling capacitor C0. A non-inverting terminal (+) of the op-amp 130 may be coupled to a first reference voltage $V_{REF0}$. The op-amp 130 may be coupled to the comparator 135 and configured to transmit an op-amp output signal $OP_{OUT}$ to the comparator 135. The op-amp 130 in conjunction with the second capacitor C1 and the third switch SW2 may be referred to as an integrator. For example, the second capacitor C1 and the third switch SW2 may be coupled between the output and the non-inverting terminal of the op-amp 130.

The comparator 135 may compare two input signals, such as the op-amp output signal $OP_{OUT}$ and a second reference voltage $V_{REF1}$. The comparator 135 may comprise any circuit and/or system suitable for comparing two input signals and outputting an output signal indicating whether one signal is greater than or less than the other signal. For example, in an exemplary embodiment, the op-amp output signal $OP_{OUT}$ is fed to a negative terminal (−) of the comparator 135 and the second reference voltage $V_{REF1}$ is fed to a positive terminal (+) of the comparator 135. The comparator 135 may transmit a comparator output OUT out of the VTC 105 and to the controller 110. The comparator output signal OUT (i.e., a VTC output signal) may indicate whether the op-amp output signal $OP_{OUT}$ is greater than (or equal to) the second reference voltage $V_{REF1}$. For example, when the op-amp output signal $OP_{OUT}$ is greater than the second reference voltage $V_{REF1}$, the comparator output signal OUT may be a logic "0", and when the op-amp output signal $OP_{OUT}$ is less than the second reference voltage $V_{REF1}$, the comparator output signal OUT may be a logic "1."

The switches are configured to selectively couple various components and/or input signals to and/or within the VTC 105. Each switch may be responsive to a control unit (not shown), for example each switch is operated according to a control signal from the control unit. Each switch may comprise any suitable circuit and/or system suitable for electrically coupling various devices and/or components, such as a transistor, an analog switch, a relay, and the like. In an exemplary embodiment, the first and second switches SW0, SW1 may be configured to selectively couple one of the input signals $IN_P$, $IN_M$ to the sampling capacitor C0. The fourth switch SW3 may be configured to selective couple the current source I to the op-amp 130. The third switch SW2 may be configured as a feedback switch to selectively couple the op-amp output terminal $OP_{OUT}$ to the op-amp negative input terminal. The first, second, third, and fourth switches SW0, SW1, SW2, SW3 may be referred to collectively as the VTC switches.

The switching circuit 140 controls the input signals and facilitates transmission of the input signals to the first and second VTCs 105A, 105B. According to an exemplary embodiment, the switching circuit 140 comprises a plurality of input switches. For example, the switching circuit 140 may comprise a first input switch SWINP0, a second input switch SWINP1, a third input switch SWINM1, and a fourth input switch SWINM0. The first and second input switches SWINP0, SWINP1 may be configured to selectivity couple the positive input signal $IN_P$ to one of the first and second VTC 105A, 105B. Similarly, the third and fourth input switches SWINM1, SWINM0 may be configured to selectively couple the negative input signal $IN_M$ to one of the first and second VTCs 105A, 105B. In general, if the positive input signal is coupled to the first VTC 105A, then the negative input signal $IN_M$ is coupled to the second VTC 105B, and vice versa. The first, second, third, and fourth input switches SWINP0, SWINP1, SWINM1, SWINM0, may be referred to collectively as the input switches.

The controller 110 controls the operation of the switches, such as the plurality of input switches and the VTC switches, and performs logic operations. For example, the controller 110 may be configured to transmit various control signals to the various switches according to desired operation of the first and second VTCs 105A, 105B. The controller 110 may be further configured to receive the first and second VTC output signals $OUT_A$, $OUT_B$. The controller 110 may comprise a counter 120 coupled to a clock signal (not shown) to measure the integration times for each of the first and second VTCs 105A, 105B. The controller 110 may be further configured to generate a start signal START and a stop signal STOP according to the VTC output signals $OUT_A$, $OUT_B$.

The counter 120 generates a logic output in incremental steps according to a pulse signal, such as a clock signal, and a control signal. For example, the counter 120 may generate the stop signal STOP and transmit the stop signal STOP to the TDC 115. The counter 120 may comprise any suitable circuit and/or system capable of counting pulses, such as asynchronous and synchronous counters. The counter may be formed using flip-flops, such as J-K flip-flops, toggle flip-flops, D flip-flops, and the like.

The controller 110 may further comprise various logic circuits, such as a logic gate 125, to perform logic operations to control the operation of the counter 120. For example, the logic gate 125 may receive the VTC output signals $OUT_A$, $OUT_B$ and transmit a binary output to the counter 120. The particular value of the binary output may operate to start or stop the counter 120. The particular value of the binary output and its effect on the counter 120 operation may be based on the type of logic gate that is used and other relevant design choices.

The TDC 115 measures a time interval and converts the time interval into a digital value. For example the TDC 115 may measure an elapsed time between the start signal START and the stop signal STOP and convert the measured time interval into the digital value. The TDC 115 may comprise any circuit and/or system suitable for measuring time intervals and converting the time interval into a digital value. For example, according to various embodiments, the TDC 115 may comprise a conventional TDC having internal registers for storage, and the TDC 115 may be coupled to a clock signal, a supply voltage, and/or a ground. In various embodiments, the TDC 115 may be configured to sum multiple time intervals to generate the digital value.

According to various embodiments, the ADC 100 generates multiple time values according to an input voltage, sums the time values, and converts the summed time value (i.e., a total time value) to a digital value. The ADC 100 may generate multiple time values by operating two TDCs out-of-phase from each other. Specifically, the ADC 100 may operate one TDC to perform the S/H operation while the other TDC performs the integration operation.

Figure 2:
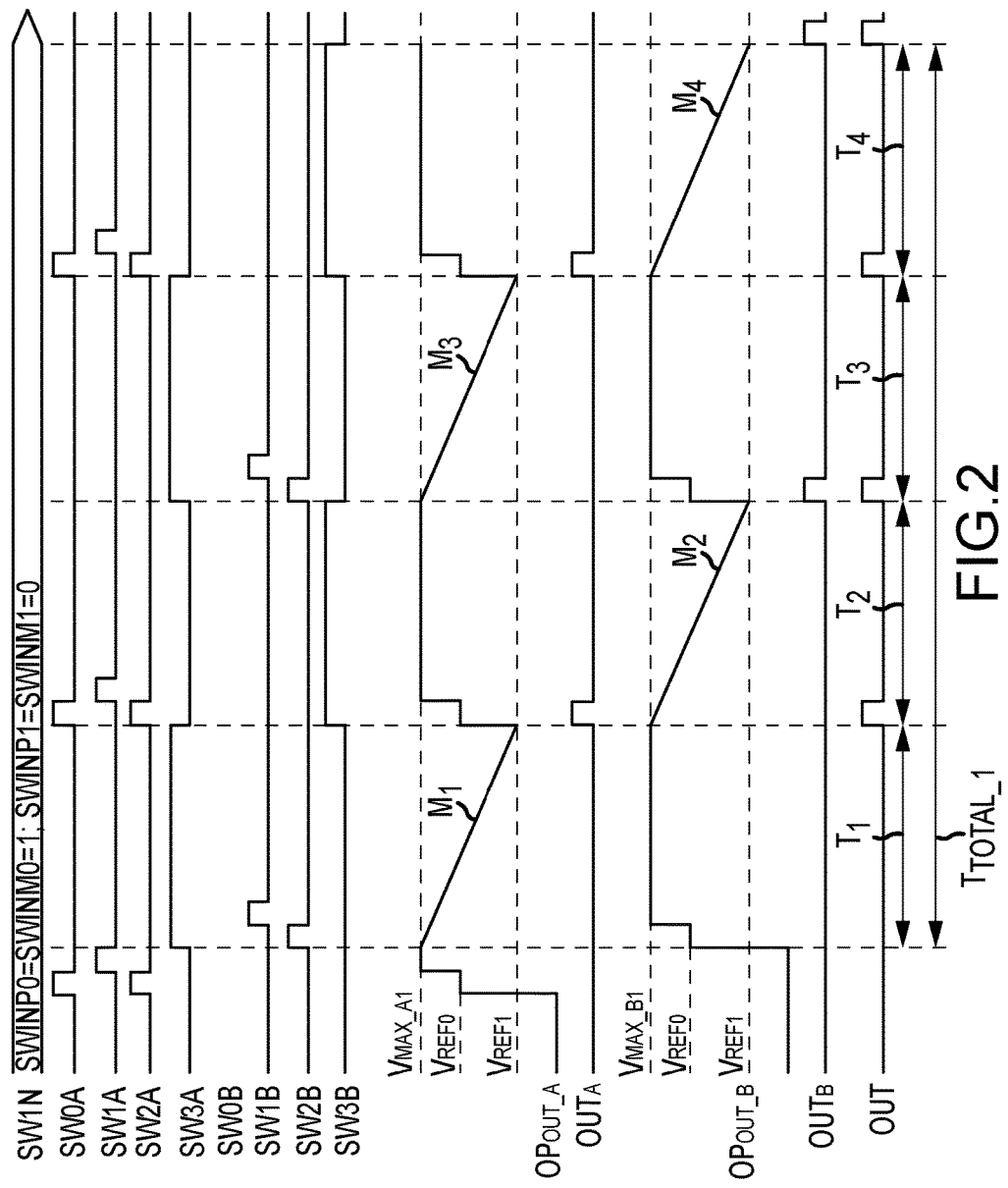
FIG. 2 is a timing diagram of the multi-cycle time-based ADC in accordance with an exemplary embodiment of the present technology.

Referring to FIGS. 1 and 2, in an exemplary operation, the controller 110 may operate the switching circuit 140 to selectively couple the first and second input signals $IN_P$, $IN_M$ to the first and second TDC 105A, 105B. For example, the controller 110 may close the first and fourth input switches SWINP0, SWINM0, while the second and third input switches SWINP1, SWINM1 remain open.

During a first integration operation (i.e., a first integration phase), the first VTC 105A may perform the integration operation according to a previously sampled input. For example, after the first and third switches SW0A, SW2A of the first VTC 105A open and close and the second switch SW1A opens and closes to sample the input signals $IN_P$, $IN_M$, the fourth switch SW3A is closed to turn on the first current source $I_A$ to discharge the sampling capacitor C0A. As a result, the first op-amp output signal $OP_{OUT\_A}$ decreases linearly over a first integration time $T_1$ wherein a rate of change of the first op-amp output signal $OP_{OUT\_A}$ over time $T_1$ may be represented by a slope $M_1$, where the slope $M_1$ is a change in the first op-amp output signal $OP_{OUT\_A}$ over time. Simultaneously, the second VTC 105B may perform the S/H operation. For example, the first and third switches SW0B, SW2B of the second VTC 105B open and close to sample the first input signal IN and then the second switch SW1B opens and closes to sample the second input signal $IN_M$. The sampled signal is held on the sampling capacitor COB.

While the first VTC 105A is converting the sampled input, the controller 110 and TDC 115 operate in conjunction with each other to measure the first period of time $T_1$. The first integration time $T_1$ is measured from a starting point, which is the beginning of the integration operation, until the first op-amp output signal $OP_{OUT\_A}$ reaches the same value as the second reference voltage $V_{REF1}$. For example, when the first op-amp output signal $OP_{OUT\_A}$ reaches the same value as the second reference voltage $V_{REF1}$, the first comparator output $OUT_A$ pulses to activate the stop signal STOP, and the TDC 115 measures the time interval between the start signal START and the stop signal STOP. Accordingly, the value of first integration time $T_1$ is proportional to the sampled input signal. The TDC 115 may store the value of the first integration time $T_1$.

According to various embodiments, the value of the first integration time $T_1$ may be described by:

$$T_1 = (IN_P - IN_M) \times \frac{C0A}{I_A} + (V_{REF0} - V_{REF1}) \times \frac{C1A}{I_A} + \alpha_A$$

where $\alpha_A$ is a time delay between the integration operation and the S/H operation.

During a second integration operation (i.e., a second integration phase), the operations of the first and second VTCs are reversed, such that the first VTC 105A performs the S/H operation and the second VTC 105B performs the integration operation. For example, switch SW3B closes to turn on the current source $I_B$ to discharge the second sampling capacitor COB while the first, second, an third switches SW0B, SW1B, SW2B are open. As a result, the second op-amp output signal $OP_{OUT\_B}$ decreases linearly over a second integration time $T_2$, wherein a rate of change of the second op-amp output signal $OP_{OUT\_B}$ over time $T_2$ may be represented by a slope $M_2$, where the slope $M_2$ is a change in second op-amp output signal $OP_{OUT\_B}$ over time. The slope $M_1$ of the first op-amp output signal $OP_{OUT\_A}$ of the first VTC 105A during the first integration operation is equal to the slope $M_2$ of the second op-amp output signal $OP_{OUT\_B}$ of the second VTC 105B during the second integration operation. The second integration time $T_2$ is measured from a starting point, which is the beginning of the integration operation of the second VTC 105B, until the second op-amp output signal $OP_{OUT\_B}$ reaches the same value as the second reference voltage $V_{REF1}$. For example, when the second op-amp output signal $OP_{OUT\_B}$ reaches the same value as the second reference voltage $V_{REF1}$, the second comparator output $OUT_B$ pulses to activate the stop signal STOP, and the TDC 115 measures the time interval between the start signal START and the stop signal STOP. Accordingly, the value of second integration time $T_2$ is proportional to the sampled input signal. The TDC 115 may add the value of the second integration time $T_2$ to the stored value of the first integration time $T_1$.

According to various embodiments, the value of the second integration time $T_2$ may be described by:

$$T_2 = (IN_P - IN_M) \times \frac{C0B}{I_B} + (V_{REF0} - V_{REF1}) \times \frac{C1B}{I_B} + \alpha_B$$

where $\alpha_B$ is a time delay between the integration operation and the S/H operation.

During a third integration operation (i.e., a third integration phase), the operations of the first and second VTCs are reversed again, such that the first VTC 105A performs the integration operation and the second VTC 105B performs the S/H operation. Again, the first VTC 105A operates in conjunction with the controller 110 and the TDC 115 to generate a third integration time $T_3$ in the same manner described above, and the TDC 115 adds the value of the third integration time $T_3$ to the first and second integration times $T_1$, $T_2$. Further, during the third integration operation, the op-amp output signal $OP_{OUT\_A}$ decreases linearly and has a slope $M_3$ equal to the slopes $M_1$ and $M_2$, and the value of the third integration time $T_3$ may be substantially equal to the value of the first integration time $T_1$.

Similarly, during a fourth integration operation (i.e., a fourth integration phase), the operations of the first and second VTCs 105A, 105B are reversed again, such that the second VTC 105B performs the integration operation and the first VTC 105A performs the S/H operation. Again, the second VTC 105B generates a fourth integrating time $T_4$ in the same manner described above, and the TDC 115 adds the value of the fourth integration time $T_4$ to the first, second, and third integration times $T_1$, $T_2$, $T_3$. Further, during the fourth integration operation, the op-amp output signal $OP_{OUT\_B}$ decreases linearly and has a slope $M_4$ equal to the slopes $M_1$, $M_2$, $M_3$ and the value of the fourth integration time $T_4$ may be substantially equal to the value of the second integration time $T_2$.

The first and second VTCs operate in this manner for a predetermined number of integration phases, wherein each integration phase produces a time value and the time value for that phase is added to previous time values. The number of integration phases may be based on the desired number of bits of the digital value, the particular application, power limitations, and other relevant factors. After the ADC 100 has completed the predetermined number of integration phases, the TDC 115 adds all of the time values to generate a first total integration time value $T_{TOTAL\_1}$, where the first total integration time value $T_{TOTAL\_1}$ may be described by the following:

$$T_{TOTAL\_1} = \sum_{i=1}^{n} T_i$$

where n is the predetermined number of integration phases. According to an exemplary embodiment, n is an even number and each VTC performs the same number of integration operations.

The TDC 115 may then convert the first total integration time value $T_{TOTAL\_1}$ into the digital value utilizing conventional methods. In this way, the size of the sampling capacitor C0 does not need to be increased to provide a longer integration time. The ADC 100 is then able to generate a digital value with improved accuracy.

A maximum output voltage $V_{MAX\_A1}$ of the op-amp output signal of the first VTC 105A may be described by:

$$V_{MAX\_A1} = (IN_P - IN_M) \times C0A/C1A + V_{REF0}$$

While a maximum output voltage $V_{MAX\_B1}$ of the op-amp output signal of the second VTC 105B may be described by:

$$V_{MAX\_B1} = (IN_P - IN_M) \times C0B/C1B + V_{REF0}$$

Figure 3:
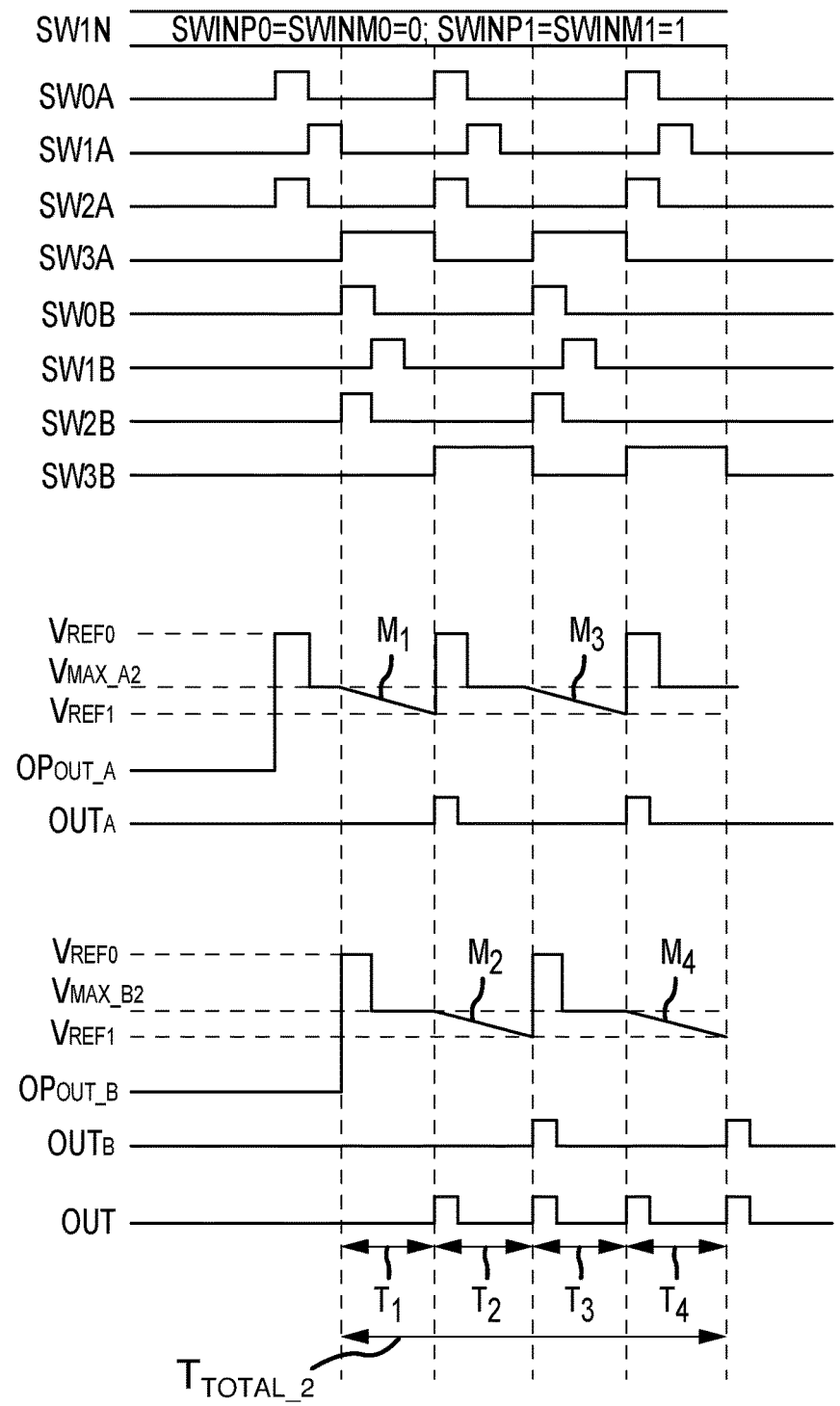
FIG. 3 is an alternative timing diagram of the multi-cycle time-based ADC in accordance with an exemplary embodiment of the present technology.

Referring to FIGS. 1 and 3, in an alternative operation, for example in a case where the first input signal $IN_P$ is greater than the second input signal $IN_M$, the controller 110 may operate the switching circuit 140 to close the second and third input switches SWINP1 and SWINM1, while the first and fourth input switches SWINP0 and SWINM0 remain open.

According to the present operation, the first and second VTCs 105A, 105B operate in the same manner as described above, wherein, as one VTC performs the S/H operation, the other VTC performs the integration operation. Similarly, during each integration operation, the first and second VTCs generate op-amp output signals $OP_{OUT\_A}$, $OP_{OUT\_B}$ having equal slopes (i.e., $M_1 = M_2 = M_3 = M_4$). The TDC 115 may operate in the manner described above, wherein TDC 115 computes a second total integration time value $T_{TOTAL\_2}$. The second total integration time value $T_{TOTAL\_2}$ may be described by:

$$T_{TOTAL\_2} = \sum_{i=1}^{n} T_i$$

where n is the predetermined number of integration phases. According to an exemplary embodiment, n is an even number and each VTC performs the same number of integration operations.

In the present operation, however, a maximum output voltage $V_{MAX\_A2}$ of the first op-amp output signal $OP_{OUT\_A}$ of the first VTC 105A is described by:

$$V_{MAX\_A2} = (IN_M - IN_P) \times C0A/C1A + V_{REF0}$$

While a maximum output voltage $V_{MAX\_B2}$ of the second op-amp output signal $OP_{OUT\_B}$ of the second VTC 105B may be described by:

$$V_{MAX\_B2} = (IN_M - IN_P) \times C0B/C1B + V_{REF0}$$

According to various operations, the ADC 100 may operate to obtain both the first total integration time value $T_{TOTAL\_1}$ and the second total integration time value $T_{TOTAL\_2}$. The TDC 115 may be configured to compute a total output $T_{OUT}$, which is proportional to the difference of the input voltage. The total output $T_{OUT}$ may be described by:

$$T_{OUT} = T_{TOTAL\_1} - T_{TOTAL\_2}$$

The TDC 115 may then convert the total output $T_{OUT}$ to a digital value.

During each integration operation, the controller 110 may receive the VTC output signals $OUT_A$, $OUT_B$, which in turn control the counter 120 and the stop signal STOP. The TDC 115 may then measure the respective integration time intervals according to the start signal START and the stop signal STOP.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A multi-cycle time-based ADC configured to receive an analog input signal, comprising:
   a first voltage-to-time converter configured to:
      perform a first integration of the analog input signal during a first phase; and
   a second voltage-to-time converter coupled in parallel with the first voltage-to-time converter and configured to perform a second integration of the analog input signal during a second phase;
   wherein the ADC is configured to:
      measure a length of time of the first integration;
      measure a length of time of the second integration; and
      sum the lengths of time to obtain a total integration time.

2. The multi-cycle time-based ADC according to claim 1, wherein the first phase and the second phase are consecutive in time.

3. The multi-cycle time-based ADC according to claim 1, further comprising an input switching circuit configured to selectively couple the analog input signal to the first and second voltage-to-time converters.

4. The multi-cycle time-based ADC according to claim 1, further comprising a controller coupled to the first and second voltage-to-time converters, wherein the controller is configured to activate a sample-and-hold operation of the first and second time-to-voltage converters.

5. The multi-cycle time-based ADC according to claim 4, further comprising a time-to-digital converter coupled to an output signal of the controller, wherein the time-to-digital converter is responsive to the output signal and measures the lengths of time of the first and second integration.

6. The multi-cycle time-based ADC according to claim 1, wherein:
   the first voltage-to-time converter is further configured to perform a sample-and-hold operation prior to the first phase; and
   the second voltage-to-converter is further configured to perform a sample-and-hold operation during the first phase.

7. The multi-cycle time-based ADC according to claim 1, wherein:
   the first voltage-to-time converter comprises an first integrator circuit configured to perform the first integration; and
   during the first integration, the first integrator circuit generates a first linearly decreasing output signal have a first rate of change.

8. The multi-cycle time-based ADC according to claim 7, wherein:
   the second voltage-to-time converter comprises a second integrator circuit configured to perform the second integration; and
   during the second integration, the second integrator circuit generates a second linearly decreasing output signal have a second rate of change equal to the first rate of change.

9. The multi-cycle time-based ADC according to claim 1, wherein
   during the first integration, the first voltage-to-time converter generates a first linearly decreasing signal have a first rate of change;
   during the second integration, the second voltage-to-time converter generates a second linearly decreasing signal have a second rate of change; and
   the first rate of change is equal to the second rate of change.

10. A method for converting an analog signal into a digital signal, comprising:
   performing a first integration operation of the analog input signal with a first voltage-to-time converter during a first phase;
   measuring a length of time of the first integration operation;
   sampling the analog input signal with a second voltage-to-time converter;
   performing a second integration operation of the analog input signal with the second voltage-to-time converter during a second phase;
   measuring a length of time of the second integration operation;
   summing the lengths of time of the first and second integration operations to determine a total integration value;
   converting the total integration value into a digital value.

11. The method according to claim 10, wherein:
   during the first integration operation, the first voltage-to-time converter generates a first linearly decreasing signal having a first rate of change; and
   during the second integration operation, the second voltage-to-time converter generates a second linearly decreasing signal having a second rate of change equal to the first rate of change.

12. The method according to claim 10, wherein the first phase and the second phase are consecutive in time.

13. The method according to claim 10, further comprising sampling the analog input signal with the first voltage-to-time converter by selectively operating a first plurality of switches prior to the first phase.

14. The method according to claim 10, further comprising sampling the analog signal with the second voltage-to-time converter by selectively operating a second plurality of switches during the first phase.

15. The method according to claim 10, wherein:
   measuring a length of time of the first integration operation comprises activating a start signal and a stop signal according to an output signal of the first voltage-to-time converter; and
   measuring a length of time of the second integration operation comprises activating the start signal and the stop signal according to an output signal of the second voltage-to-time converter.

16. An ADC configured to receive an analog input signal, comprising:
   a first voltage-to-time converter, configured to generate an first output signal, comprising:
      a first integrator circuit configured to perform a first integration during a first phase, wherein the first integrator circuit generates a first integrator output signal;
   a second voltage-to-time converter, coupled in parallel with the first voltage-to-time converter, comprising:
      a second integrator circuit configured to perform a second integration during a second phase, wherein the second integrator circuit generates a second integrator output signal;
   a controller coupled to the first and second voltage-to-time converters and responsive to the first and second output signals; and
   a time-to-digital converter coupled to and responsive to the controller, wherein the time-to-digital converter is configured to:

measure a length of time of the first integration;
measure a length of time of the second integration; and
sum the lengths of time to obtain a total integration time.

17. The ADC according to claim 16, wherein the first phase and the second phase are consecutive in time.

18. The ADC according to claim 16, wherein the first and second integrator output signals have equal rates of change that decrease linearly.

19. The ADC according to claim 16, wherein:
the first voltage-to-time converter is further configured to perform a sample-and-hold operation prior to the first phase; and
the second voltage-to-converter is further configured to perform a sample-and-hold operation during the first phase.

20. The ADC according to claim 16, wherein:
each voltage-to-time converter cyclically performs integration and a sample-and-hold operation for a predetermined number of cycles; and
the cycles of the voltage-to-time converters are out of phase from each other.

* * * * *